(12) United States Patent
Yeh

(10) Patent No.: US 7,894,171 B2
(45) Date of Patent: Feb. 22, 2011

(54) CIRCUIT FOR PROTECTING NMOS DEVICE FROM VOLTAGE STRESS

(75) Inventor: Chun-Wen Yeh, Jhubei (TW)

(73) Assignee: MSTAR Semiconductor, Inc., Hsinchu Hsien (TW)

( * ) Notice: Subject to any disclaimer, the term of this patent is extended or adjusted under 35 U.S.C. 154(b) by 329 days.

(21) Appl. No.: 12/155,613

(22) Filed: Jun. 6, 2008

(65) Prior Publication Data

US 2009/0103220 A1    Apr. 23, 2009

(30) Foreign Application Priority Data

Oct. 17, 2007    (TW) ............... 96138799 A

(51) Int. Cl.
*H02H 9/00*    (2006.01)
(52) U.S. Cl. ....................................... 361/56
(58) Field of Classification Search ................. 361/56
See application file for complete search history.

(56) References Cited

U.S. PATENT DOCUMENTS

| 4,835,487 A * | 5/1989 | Doyle et al. ............. 330/277 |
| 5,930,094 A * | 7/1999 | Amerasekera et al. ........ 361/56 |
| 6,212,050 B1 * | 4/2001 | Haider ..................... 361/86 |
| 6,327,126 B1 * | 12/2001 | Miller et al. .............. 361/56 |
| 7,027,276 B2 * | 4/2006 | Chen ...................... 361/56 |
| 7,291,887 B2 | 11/2007 | Chiu et al. |
| 7,348,855 B2 * | 3/2008 | Wu ........................ 330/300 |
| 2008/0225451 A1 * | 9/2008 | Ansel et al. ............... 361/56 |

FOREIGN PATENT DOCUMENTS

| TW | 410502 B | 11/2000 |
| TW | 582109 B | 4/2004 |

* cited by examiner

*Primary Examiner*—Jared J Fureman
*Assistant Examiner*—Scott Bauer
(74) *Attorney, Agent, or Firm*—Rabin & Berdo, P.C.

(57) ABSTRACT

A protection circuit for an NMOS device is provided. The protection circuit includes a cascoding NMOS transistor and an adjusting circuit. The cascoding NMOS transistor is cascoded between the NMOS device and an external voltage source. The adjusting circuit is coupled to the external voltage source, a gate of the cascoding NMOS transistor, and an internal voltage source. The adjusting circuit adjusts the voltage at the gate of the cascoding NMOS transistor according to the voltages of the external voltage source and the internal voltage source so as to protect the NMOS device from a voltage stress caused by the external voltage source.

6 Claims, 3 Drawing Sheets

CIRCUIT FOR PROTECTING NMOS DEVICE FROM VOLTAGE STRESS

BACKGROUND OF THE INVENTION

1. Field of the Invention

The present invention relates to protection circuits and, in particular, to circuits for protecting NMOS devices from excessive voltage stress.

2. Description of the Prior Art

In recent years, the technology of integrated circuits has been improved rapidly, and the size of CMOS transistors has been continuously diminished. To conform to the characteristic of small-sized components and reduce the power consumed by CMOS transistors, generally, the voltage level of power provided to the transistors is also decreased along with the size of CMOS transistors.

However, IC chips manufactured in early years still use higher power voltages (e.g. 5V). To cooperate with circuits using higher power voltages, circuits using lower power voltages (e.g. 3.3V or 1.8V) must include interface circuits with special configurations. Please refer to FIG. 1, which illustrates an exemplary interface circuit in the prior art.

As shown in FIG. 1, a cascoding NMOS transistor (NC) is coupled between an NMOS device (ND) and an external voltage source ($V_{EXT}$). The gate of NC is usually coupled to an internal voltage source ($V_{INT}$) of the IC which includes NC. The function of NC is to provide a cross voltage between its drain and source, and thereby ND does not have to directly endure the high voltage stress induced by the external voltage source $V_{EXT}$.

For instance, the voltages of the external voltage source $V_{EXT}$ and the internal voltage source $V_{INT}$ are assumed as 5V and 3.3V, respectively. The voltage at the source of NC is typically lower than that of at its gate; their voltage difference is the threshold voltage of NC. Therefore, when the gate voltage of NC is 3.3V, the source voltage of NC will substantially be 2.3V. Under this condition, the cross voltage between the drain and source of NC is 2.7V. Because this cross voltage is in an endurable range, NC will not be damaged by excessive voltage stress and can provide protection for ND.

However, if the voltage of the external voltage source $V_{EXT}$ is 5V and the voltage of the internal voltage source $V_{INT}$ is reduced to 1.8V, the voltage at the source of NC will be approximately 1V. Hence, the cross voltage between the drain and source of NC will be 4V. Under this condition, NC will probably be damaged by the cross voltage and lose the function of ND protection.

SUMMARY OF THE INVENTION

To solve the aforementioned problem, the invention provides a protection circuit. In the protection circuit, the voltage provided to the gate of NC is relative to the voltages of external/internal voltage sources. More specifically, this gate voltage is appropriately adjusted according to the voltage of the external/internal voltage sources. Thereby, the protection circuit can keep NC in normal operations even if the voltages of external/internal voltage sources have been changed, and accordingly can protect ND from excessive voltage stress induced by the external voltage source.

One embodiment according to the invention is a protection circuit for an NMOS device. The protection circuit includes a cascoding NMOS transistor and an adjusting circuit. The cascoding NMOS transistor is cascoded between the NMOS device and an external voltage source. The adjusting circuit is coupled to the external voltage source, a first internal voltage source, and a gate of the cascoding NMOS transistor. According to the voltages of the external voltage source and the first internal voltage source, the adjusting circuit adjusts the voltage at the gate of the cascoding NMOS transistor, so as to protect the NMOS device from the excessive voltage stress caused by the external voltage source.

The advantage and spirit of the invention may be understood by the following recitations together with the appended drawings.

BRIEF DESCRIPTION OF THE APPENDED DRAWINGS

FIG. 3(A), FIG. 3(B), FIG. 4, and FIG. 5 illustrate detailed examples of the adjusting circuit according to the invention.

DETAILED DESCRIPTION OF THE INVENTION

Figure 1:
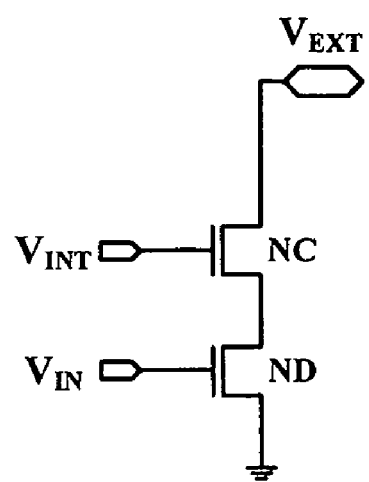
FIG. 1 illustrates an exemplary interface circuit in the prior art.
Figure 2:
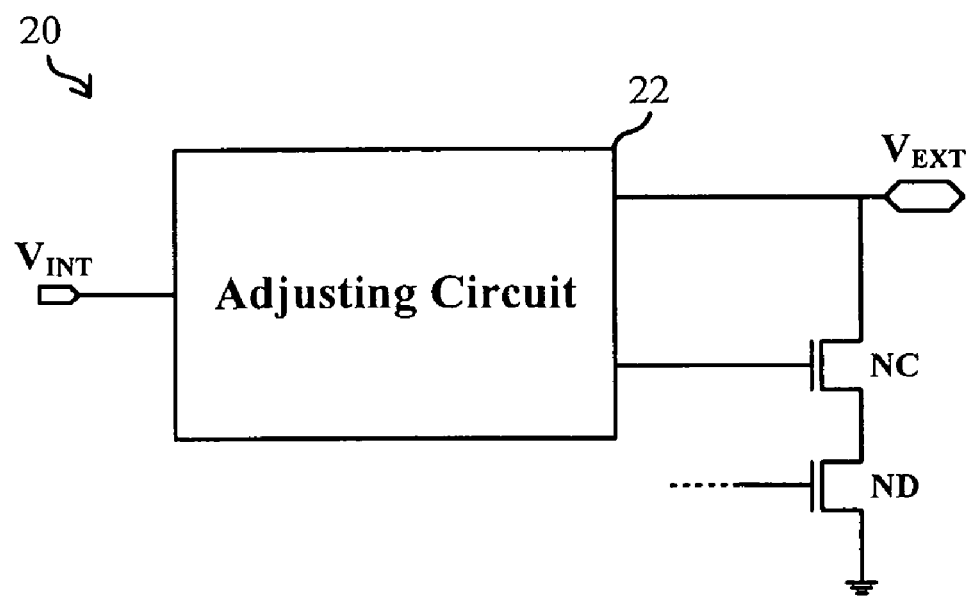
FIG. 2 shows the protection circuit according to the invention.

One embodiment according to the invention is a protection circuit for an NMOS device as shown in FIG. 2. In this embodiment, the protection circuit 20 is used for protecting the NMOS device, ND, from excessive voltage stress. As shown in FIG. 2, the protection circuit 20 includes a cascoding. NMOS transistor (NC) and an adjusting circuit 22.

The transistor NC is cascoded between ND and an external voltage source, $V_{EXT}$. The adjusting circuit 22 is coupled to the external voltage source $V_{EXT}$, a first internal voltage source $V_{INT}$, and the gate of NC. According to the voltages of the external voltage source $V_{EXT}$ and the first internal voltage source $V_{INT}$, the adjusting circuit 22 adjusts the gate voltage of NC.

When the voltage of the external voltage source $V_{EXT}$ is lower than or equal to the voltage of the first internal voltage source $V_{INT}$, the adjusting circuit 22 can set the gate voltage of NC to be substantially equal to the voltage of the first internal voltage source $V_{INT}$. On the contrary, when the voltage of the external voltage source $V_{EXT}$ is higher than the voltage of the first internal voltage source $V_{INT}$, the adjusting circuit 22 can appropriately increase the gate voltage of NC, so as to reduce the cross voltage between the drain and source of NC. Thereby, the adjusting circuit 22 prevents NC from being damaged by excessive voltage stress. Furthermore, the protection circuit 20 can protect ND against the voltage stress induced by the external voltage source $V_{EXT}$.

For example, assume the voltage of the first internal voltage source $V_{INT}$ is 1.8V. If the voltage of the external voltage source $V_{EXT}$ ranges from 0V to 1.8V, the adjusting circuit 22 can set the gate voltage of NC as 1.8V. On the contrary, if the voltage of the external voltage source $V_{EXT}$ ranges from 1.8V to 5V, the adjusting circuit 22 can raise the gate voltage of NC up to 1.8V~3.3V. A relative ratio can be maintained between the gate voltage of NC and the voltage of the external voltage source $V_{EXT}$.

Figure 3A:
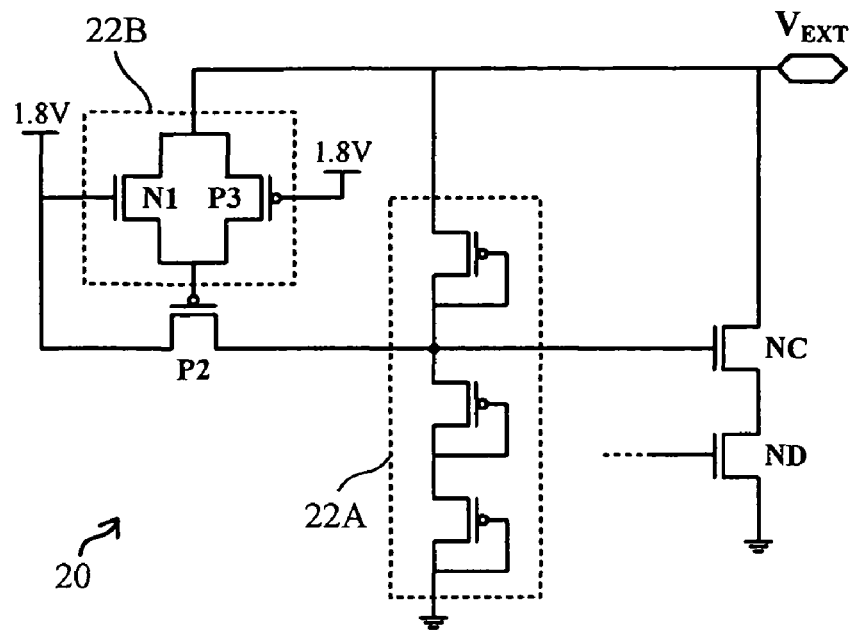

Please refer to FIG. 3(A), which illustrates a detailed example of the adjusting circuit 22. In this example, the voltage of the first internal voltage source $V_{INT}$ is 1.8V. The adjusting circuit 22 includes a voltage divider 22A, a switch 22B, and a second PMOS (P2). The voltage divider 22A is coupled between the external voltage source $V_{EXT}$ and a second internal voltage source (i.e. the ground). The voltage divider 22A in this example is formed of MOS transistors; in actual applications, the constitution of the voltage divider 22A is not limited to transistors. Moreover, the switch 22B is coupled between the external voltage source $V_{EXT}$ and the gate of P2. The source and drain of P2 are coupled to the first internal voltage source $V_{INT}$ and the gate of NC, respectively.

In this example, the switch 22B includes a third PMOS transistor (P3) and a first NMOS transistor (N1) coupled in the form of a transmission gate. Both the gates of P3 and N1 are coupled to the first internal voltage source $V_{INT}$. When the voltage ranges between 0~1.8V, the gate voltage of P2 will be slightly lower than 1.8V. Because of the small voltage difference between the gate and source of P2, P2 will be in a condition of linear or sub-threshold. Hence, the gate voltage of NC will be charged to 1.8V through P2. Since the voltage of the external voltage source $V_{EXT}$ is not higher than 1.8V, NC will not have the problem of excessive voltage stress and can provide protection for ND.

The divided voltage provided from the voltage divider 22A to the gate of NC varies according to the voltage of the external voltage source $V_{EXT}$. By appropriately designing the resistors in the voltage divider 22A, when the voltage of the external voltage source $V_{EXT}$ is 5V, the voltage provided to the gate of NC can be set as 3.3V. Under this condition, the source voltage of NC is approximately 2.3V, and the cross voltage between the drain and source of NC is approximately 2.7V. Because this cross voltage is still in an endurable range for NC, NC can operate normally and protect ND. In addition, when the voltage of the external voltage source $V_{EXT}$ is 5V, and the gate voltage of P2 also approximately equals 5V, P2 is accordingly turned off.

Figure 3B:
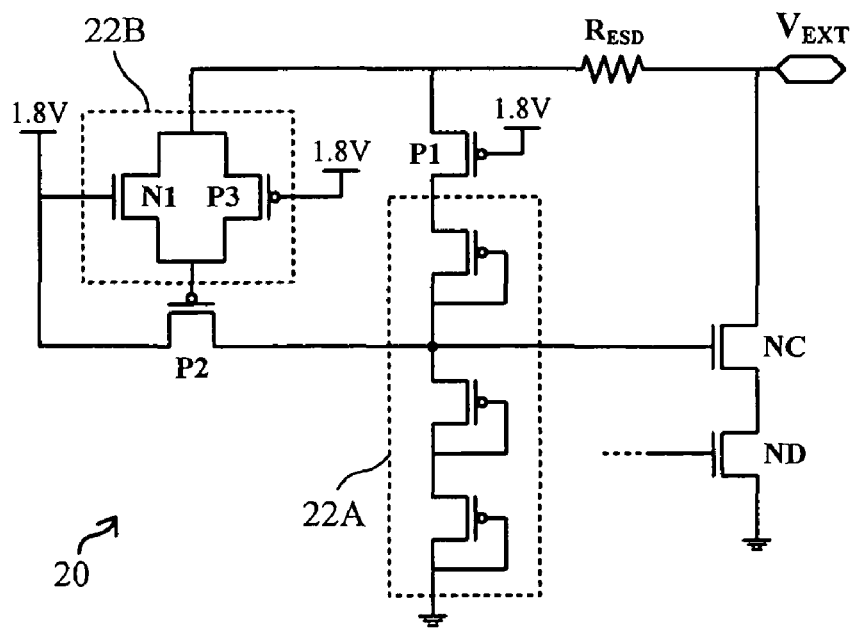

Please refer to FIG. 3(B), which illustrates another detailed example of the adjusting circuit 22. In this example, the adjusting circuit 22 further includes a first PMOS transistor (P1) and an electrostatic discharge (ESD) resistor ($R_{ESD}$). The resistor $R_{ESD}$ is used for preventing the circuits connected to the external voltage source $V_{EXT}$ from being damaged by electrostatic currents.

The gate, source, and drain of P1 are respectively coupled to the first internal voltage source $V_{INT}$, the external voltage source $V_{EXT}$, and the voltage divider 22A. When the voltage of the external voltage source $V_{EXT}$ ranges from 0V to 1.8V, P1 will be switched off. Therefore, when the voltage divider 22A is formed of resistors and the voltage of the external voltage source $V_{EXT}$ is 0V, there will not be a leakage path between the gate of NC and the external voltage source $V_{EXT}$. Accordingly, the gate voltage of NC will not be affected by leakage currents.

Figure 4:
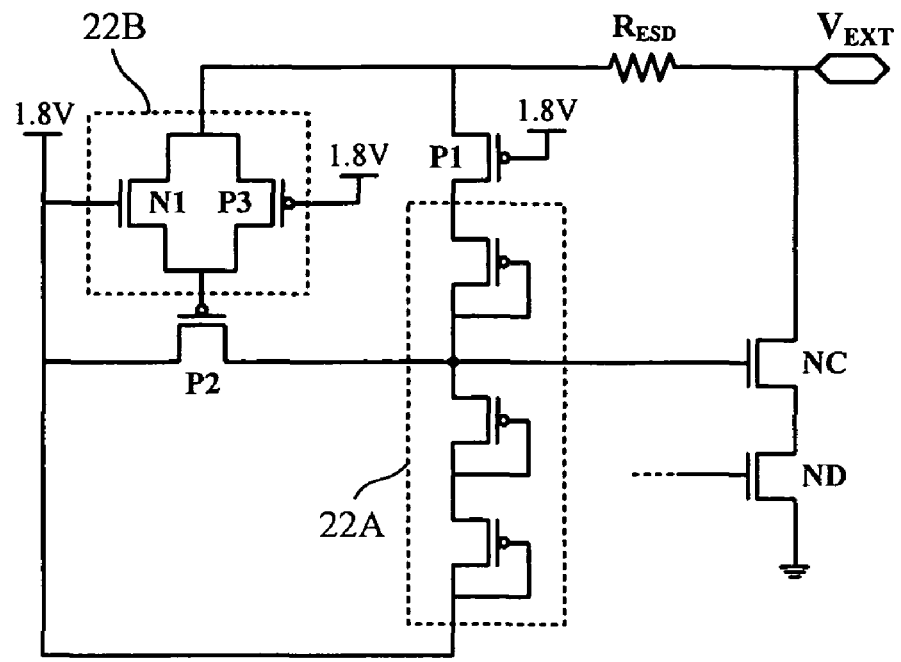

Please refer to FIG. 4 which illustrates another detailed example of the adjusting circuit 22. In this example, the two ends of the voltage divider 22A are respectively coupled to the external voltage source $V_{EXT}$ and the first internal voltage source $V_{INT}$. Hence, when the voltage of the external voltage source $V_{EXT}$ is lower than 1.8V (i.e. when the transistor P2 is turned on), the voltage divider 22A will not provide a leakage path between the first internal voltage source $V_{INT}$ and the ground.

Figure 5:
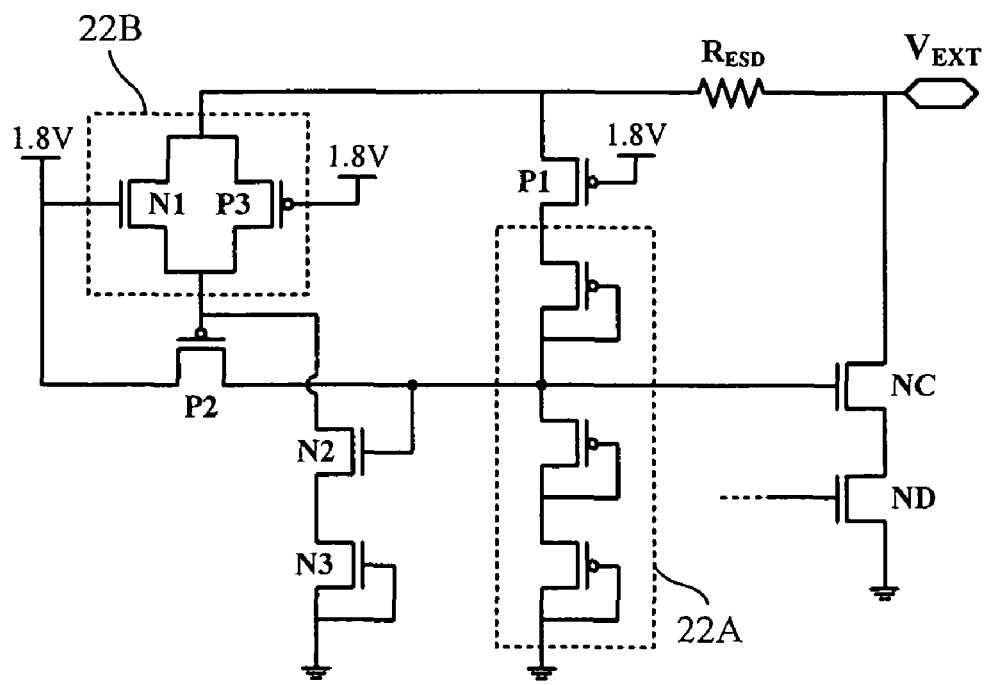

In actual applications, when the voltage of the first internal voltage source $V_{INT}$ is 1.8V, the gate voltage of P2 will probably be charged to 1.8V due to sub-threshold currents. P2 may be accordingly turned off and causes the gate voltage of NC to enter an uncertain status. To prevent this condition from happening, the adjusting circuit 22 can further include a second NMOS (N2) and a third NMOS (N3) as shown in FIG. 5. These two added NMOSs can provide a small leakage path between the gate of P2 and the ground. Hence, the gate voltage of P2 will be kept as slightly lower than 1.8V; the problem that P2 might be turned off is accordingly solved.

As described above, in the protection circuit according to the invention, the voltage provided to the gate of NC is appropriately adjusted according to the voltage of the external/internal voltage sources. Thereby, the protection circuit according to the invention can keep NC in normal operations, and accordingly protect ND from excessive voltage stress induced by the external voltage source.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A protection circuit for protecting an NMOS device from an excessive voltage stress, comprising:
   a cascoding NMOS transistor cascoded between the NMOS device and a first voltage source; and
   an adjusting circuit, coupled to the first voltage source, a second voltage source, and a gate of the cascoding NMOS transistor, for adjusting the voltage at the gate of the cascoding NMOS transistor according to the voltages of the first voltage source and the second voltage source, so as to protect the NMOS device from the excessive voltage stress caused by the first voltage source, wherein the adjusting circuit includes
   a voltage divider, coupled between the first voltage source and a third voltage source, and configured so as to provide a divided voltage to the gate of the cascading NMOS transistor when the voltage of the first voltage source is higher than the voltage of the second voltage source, and
   a first PMOS transistor having a gate coupled to the second voltage source, a source coupled to the first voltage source, and a drain coupled to the voltage divider.

2. The protection circuit of claim 1, further comprising an ESD resistor coupled between the first voltage source and the adjusting circuit.

3. A protection circuit for protecting an NMOS device from an excessive voltage stress, comprising:
   a cascoding NMOS transistor cascoded between the NMOS device and a first voltage source; and
   an adjusting circuit, coupled to the first voltage source, a second voltage source and a gate of the cascoding NMOS transistor, for adjusting the voltage at the gate of the cascoding NMOS transistor according to the voltages of the first voltage source and the second voltage source, so as to protect the NMOS device from excessive voltage stress caused by the first voltage source, wherein the adjusting circuit includes
   a voltage divider, coupled between the first voltage source and the second voltage source configured to provide a divided voltage to the gate of the cascoding NMOS transistor when the voltage of the first voltage source is higher than the voltage of the second voltage source, and
   a first PMOS transistor having a gate coupled to the second voltage source, a source coupled to the first voltage source and a drain coupled to the voltage divider.

4. A protection circuit for protecting an NMOS device from an excessive voltage stress, comprising:
   a cascoding NMOS transistor cascoded between the NMOS device and a first voltage source; and
   an adjusting circuit, coupled to the first voltage source, a second voltage source, and a gate of the cascoding NMOS transistor, for adjusting the voltage at the gate of the cascoding NMOS transistor according to the voltages of the first voltage source and the second voltage source, so as to protect the NMOS device from excessive voltage stress caused by the first voltage source, wherein the adjusting circuit including a switch, and a second PMOS transistor, wherein the switch is coupled between the first voltage source and a gate of the second PMOS transistor, a source of the second PMOS transistor is coupled to the second voltage source, a drain of the second PMOS transistor is coupled to the gate of the cascoding NMOS transistor, and the switch is configured to turn on the second PMOS transistor when the voltage of the first voltage source is lower than the voltage of the second voltage source.

5. The protection circuit of claim 4, wherein the switch comprises a third PMOS transistor and a first NMOS transistor coupled in the form of a transmission gate; a gate of the third PMOS transistor and a gate of the first NMOS transistor are both coupled to the second voltage source.

6. The protection circuit of claim 4, wherein the adjusting circuit further comprises a second NMOS transistor and a third NMOS transistor, a gate of the second NMOS transistor is coupled to the gate of the cascoding NMOS transistor, a drain of the second NMOS transistor is coupled to the gate of the second PMOS transistor, a source of the second NMOS transistor is coupled to a drain of the third NMOS transistor, and a gate and a source of the third NMOS transistor are both coupled to a third voltage source.

* * * * *